United States Patent
Park et al.

(10) Patent No.: US 10,285,272 B2
(45) Date of Patent: May 7, 2019

(54) CAPACITOR COMPONENT

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 89 days.

(21) Appl. No.: 15/407,826

(22) Filed: Jan. 17, 2017

(65) Prior Publication Data

US 2017/0367188 A1 Dec. 21, 2017

(30) Foreign Application Priority Data

Jun. 20, 2016 (KR) .................. 10-2016-0076856

(51) Int. Cl.

| H05K 1/18 | (2006.01) |
|---|---|
| H01G 4/012 | (2006.01) |
| H01G 4/12 | (2006.01) |
| H01G 4/232 | (2006.01) |
| H01G 4/248 | (2006.01) |
| H01G 4/30 | (2006.01) |
| H05K 3/34 | (2006.01) |

(52) U.S. Cl.
CPC ............. *H05K 1/181* (2013.01); *H01G 4/012* (2013.01); *H01G 4/12* (2013.01); *H01G 4/232* (2013.01); *H01G 4/248* (2013.01); *H01G 4/30* (2013.01); *H05K 3/3442* (2013.01); *H05K 2201/10015* (2013.01); *Y02P 70/613* (2015.11)

(58) Field of Classification Search
CPC ...................................................... H05L 1/181
USPC ............................................................ 174/260
See application file for complete search history.

(56) References Cited

U.S. PATENT DOCUMENTS

| 5,450,278 A | 9/1995 | Lee et al. |
|---|---|---|
| 2007/0121275 A1 | 5/2007 | Takashima et al. |
| 2009/0141427 A1* | 6/2009 | Lyoo ............... C04B 35/468 361/321.4 |
| 2009/0244807 A1* | 10/2009 | Lee .................. H01G 4/005 361/306.2 |
| 2010/0033897 A1* | 2/2010 | Lee .................. H01G 4/012 361/329 |

(Continued)

FOREIGN PATENT DOCUMENTS

| JP | 06-140283 A | 5/1994 |
|---|---|---|
| KR | 10-2007-0053800 A | 5/2007 |

(Continued)

*Primary Examiner* — Stanley Tso
(74) *Attorney, Agent, or Firm* — McDermott Will & Emery LLP

(57) ABSTRACT

A capacitor component includes a body including a plurality of dielectric layers having a stacked structure and a plurality of first internal electrodes and a plurality of second internal electrodes alternately disposed with dielectric layers disposed therebetween. A first external electrode is on a first surface and a second surface of the body, on the opposing side of the body, and connected to the plurality of first internal electrodes. A second external electrode is on a third surface and a fourth surface of the body, opposing each other, and connected to one or more of the plurality of second internal electrodes.

10 Claims, 6 Drawing Sheets

(56) References Cited

U.S. PATENT DOCUMENTS

2010/0091427 A1    4/2010  Lee et al.
2015/0014040 A1*   1/2015  Ahn .................... H01G 4/30
                                                174/260

FOREIGN PATENT DOCUMENTS

KR    10-2010-0040562 A    4/2010
KR       10-0983122 B1     9/2010

* cited by examiner

CAPACITOR COMPONENT

CROSS-REFERENCE TO RELATED APPLICATION

This application claims the benefit of priority to Korean Patent Application No. 10-2016-0076856, filed on Jun. 20, 2016 with the Korean Intellectual Property Office, the entirety of which is incorporated herein by reference.

BACKGROUND

1. Field

The present disclosure relates to a capacitor component.

2. Description of Related Art

A multilayer ceramic capacitor (MLCC), a capacitor component, is a condenser in the form of a chip serving to charge or discharge electricity while mounted on a printed circuit board of a Liquid Crystal Display (LCD), a Plasma Display Panel (PDP), or the like, of various electronic products such as video cameras, computers, smartphones, mobile phones, and the like.

An MLCC may be used as a component of various electronic devices since an MLCC is small, ensures high capacity, and is easily mounted.

A power supply device for a central processing unit (CPU) of a computer or the like may have a problem where voltage noise occurs due to a rapid change in a load current while a low voltage is provided. MLCCs have been widely used in power supply devices for the use of a decoupling capacitor for suppressing voltage noise. When using an MLCC for decoupling or the like, attempts have been made to reduce impedance in a wide band.

SUMMARY

An aspect of the present disclosure provides a capacitor component having a plurality of resonance frequencies to effectively control impedance in a wide frequency band. Another aspect of the present disclosure provides a component having a reduced size by including the capacitor component described above.

According to an aspect of the present disclosure, a novel capacitor component includes a body including a plurality of dielectric layers having a stacked structure and a plurality of first and second internal electrodes alternately disposed with the dielectric layers disposed therebetween. A first external electrode is on a first surface and a second surface of the body, on the opposing side of the body, and connected to the plurality of first internal electrodes. A second external electrode is on a third surface and a fourth surface of the body, opposing each other, and connected to the plurality of second internal electrodes. The capacitor component may be divided into a plurality of capacitor units, each of which include a portion of the plurality of first internal electrodes and a portion of the plurality of second internal electrodes. The plurality of capacitor units include a first capacitor unit and a second capacitor unit. The first capacitor unit has a structure of a through-type capacitor in which the first internal electrodes are connected to the first external electrode by a lead out portion exposed to the first surface and the second surface.

At least a portion of the plurality of capacitor units may generate different resonance frequencies from those of a remaining portion thereof.

The first internal electrodes included in the second capacitor unit may be connected to the first external electrode by a lead out portion exposed to at least one of the first surface and the second surface.

A lead out portion of the first internal electrodes in the first capacitor unit may have a width greater than that of a lead out portion of the first internal electrode included in the second capacitor unit.

A lead out portion of the first internal electrodes in the second capacitor unit may be disposed in a position to one side of a center line of the first internal electrode.

A lead out portion of the second internal electrodes in the second capacitor unit may be disposed in a position to one side of a center line of the second internal electrode.

A lead out portion of the second internal electrodes in the second capacitor unit may be disposed in a position to one side of a center line of the second internal electrode in a direction away from the lead out portions of the first internal electrode in the second capacitor unit.

The second internal electrodes in the first capacitor unit may be connected to the second external electrode through a lead out portion exposed to the third surface and the fourth surface.

The second internal electrodes in the second capacitor unit may be connected to the second external electrode through a lead out portion exposed to at least one of the third surface and the fourth surface.

A lead out portion of the second internal electrodes in the first capacitor unit may have a width greater than that of a lead out portion of the second internal electrodes in the second capacitor unit.

The second capacitor unit may be above the first capacitor unit.

In the body, a marking unit indicating a mounting direction of the capacitor component may be formed therein.

The marking unit may be formed of ceramic, a different material from that of a different region of the body.

According to an aspect of the present disclosure, a mounting structure of a capacitor component includes a capacitor component that includes a body including a plurality of dielectric layers having a stacked structure and a plurality of first and second internal electrodes alternately disposed with the dielectric layers disposed therebetween. A first external electrode is on a first surface and a second surface of the body, on the opposing side of the body, and connected to the plurality of first internal electrodes. A second external electrode is on a third surface and a fourth surface of the body, opposing each other, and connected to the plurality of second internal electrodes. The capacitor component is divided into a plurality of capacitor units, each of which includes a portion of the plurality of first internal electrodes and a portion of the plurality of second internal electrodes. The plurality of capacitor units include a first capacitor unit and a second capacitor unit. The mounting structure of a capacitor component includes a mounting substrate on which the capacitor component is disposed. The first capacitor unit is a through-type capacitor in which the first internal electrodes are connected to the first external electrode by a lead out portion exposed to the first surface and the second surface.

In the capacitor component, the first capacitor unit may be disposed to oppose the mounting substrate.

The mounting substrate may include three circuit patterns connected to the first external electrode and the second external electrode.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
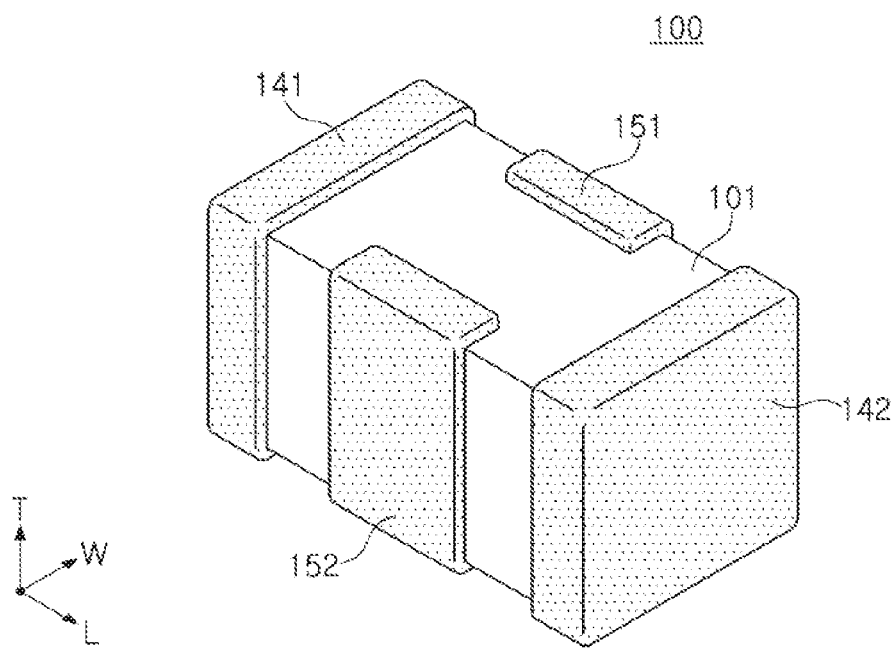
FIG. 1 is a perspective view schematically illustrating a capacitor component according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "above," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Figure 2:
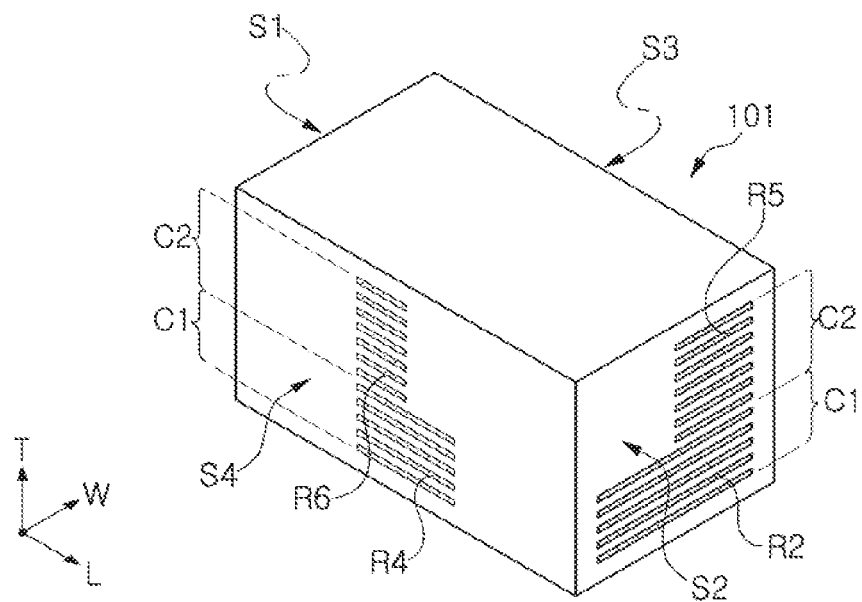
FIG. 2 is a perspective view schematically illustrating a form of a body in the capacitor component of FIG. 1.
Figure 3:
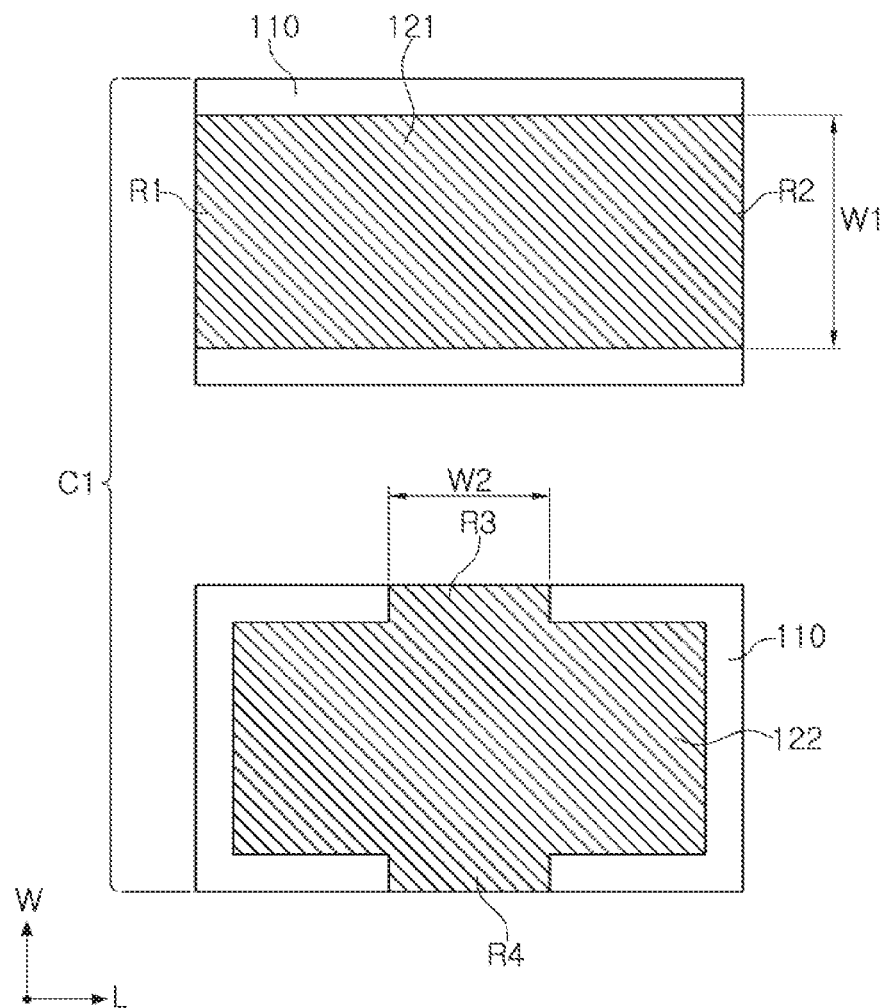
FIG. 3 is a plan view schematically illustrating a form of a first internal electrode and a second internal electrode included in a first capacitor unit in the capacitor component of FIG. 1.
Figure 4:
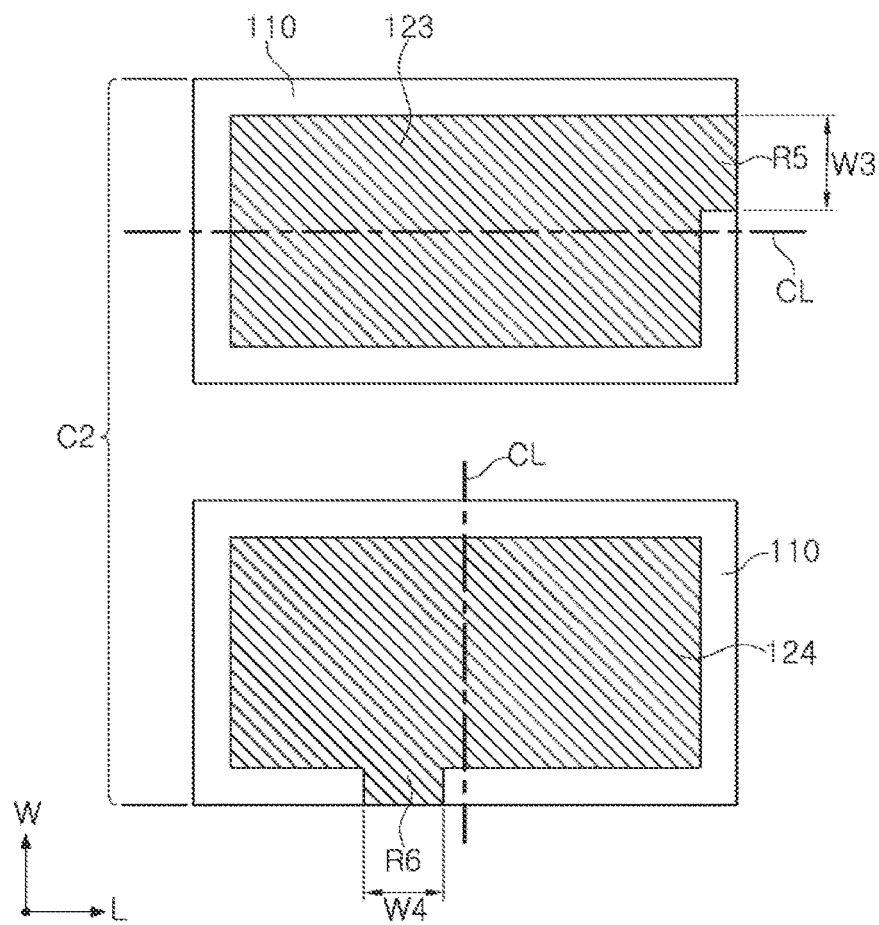
FIG. 4 is a plan view schematically illustrating a form of a first internal electrode and a second internal electrode included in a second capacitor unit in the capacitor component of FIG. 1.

FIG. 1 is a perspective view schematically illustrating a capacitor component according to an exemplary embodiment. FIG. 2 is a perspective view schematically illustrating a form of a body in the capacitor component of FIG. 1. FIG. 3 is a plan view schematically illustrating a form of a first internal electrode and a second internal electrode included in a first capacitor unit in the capacitor component of FIG. 1. FIG. 4 is a plan view schematically illustrating a form of a first internal electrode and a second internal electrode included in a second capacitor unit in the capacitor component of FIG. 1.

With reference to FIGS. 1 to 4, the capacitor component 100 according to an exemplary embodiment may include a body 101, first internal electrodes 121 and 123, second internal electrodes 122 and 124, first external electrodes 141 and 142, and second external electrodes 151 and 152. The capacitor component may be divided into a plurality of capacitor units C1 and C2, and each of the plurality of capacitor units C1 and C2 includes a portion of a plurality of first and second internal electrodes 121 to 124. The first capacitor unit C1 may form a through-type capacitor in which first internal electrodes 121 are connected to the first external electrodes 141 and 142 through lead out portions R1 and R2. The plurality of capacitor units include the first capacitor unit C1 and second capacitor unit C2, but may include one or more additional capacitor units.

The first external electrodes 141 and 142 may respectively be formed on at least the first surface S1 and the second surface S2 of the body 101 opposing each other, to be connected to the first internal electrodes 121 and 123. The first external electrode 141 is on the first surface S1, and the first external electrode 142 is on the second surface S2. The first surface S1 and the third surface S3 may be perpendicular to each other, whereby the body 101 may have a rectangular parallelepiped or a shape similar thereto.

The second external electrodes 151 and 152 may respective be formed on at least one of the third surface S3 and the fourth surface S4 of the body 101, which surfaces connect the first surface S1 to the second surface S2 and oppose each other, and connected to the second internal electrodes 122 and 124. The second external electrodes 151 and 152 may have a 4-terminal structure formed on all of the third surface S3 and the fourth surface S4. As will be described later, the capacitor component 100 may be disposed to allow the first capacitor unit C1 to oppose a mounting substrate. The first surface S1 and the fourth surface S4 may be perpendicular to the mounting substrate.

The body 101 may include a plurality of dielectric layers 110 having a stacked structure, and first internal electrodes and second internal electrodes 121 to 124 alternately disposed with dielectric layers 110 disposed therebetween. The dielectric layers 110 included in the body 101 may be formed of a dielectric material known in the art such as ceramic or the like, for example, $BaTiO_3$ (barium titanate)-based ceramic powder or the like. In this case, $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$ or $Ba(Ti_{1-y}Zr_y)O_3$, in which calcium (Ca), zirconium (Zr) or the like is added to $BaTiO_3$, but are not limited thereto.

As described above, the first capacitor unit C1 and the second capacitor unit C2 can have different resonance frequencies to improve noise removal when the capacitor component 100 is applied as a filter or the like. In this case, the first capacitor unit C1 is provided as a 3-terminal type and through-type capacitor, and the second capacitor unit C2 is provided as a 2-terminal type capacitor. The second capacitor unit C2 may have relatively high direct current equivalent inductance (ESL). An external terminal configuration such as a 3-terminal structure, a 2-terminal or the like, exemplified in an exemplary embodiment, may be modified in a range to maintain the technical idea of the exemplary embodiment. Hereinafter, specific configurations with respect to the first capacitor unit C1 and the second capacitor unit C2 will be described.

With reference to FIGS. 2 to 4, the first capacitor unit C1 is a through-type capacitor in which the first internal electrodes 121 are connected to the first external electrodes 141 and 142 through the lead out portions R1 and R2 respectively exposed to the first surface S1 and the second surface S2. The second internal electrodes 122 in the first capacitor unit C1 may be connected to the second external electrodes 151 and 152 through lead out portions R3 and R4 respectively exposed to the third surface S3 and the fourth surface S4.

A width W1 of the lead out portions R1 and R2 of the first internal electrodes 121 included in the first capacitor unit C1 can be greater than a width W3 of a lead out portion R5 of the first internal electrodes 123 included in the second capacitor unit C2. In the first capacitor unit C1 and the second capacitor unit C2, widths of lead out portions of the first internal electrodes 121 and 123 can be different from each other to allow lead out portions R5 and R6 of the first internal electrode 123 and the second internal electrode 124 in the second capacitor unit C2 to be relatively spaced away from each other so as to increase ESL. Thus, resonance frequencies may be generated in a low frequency side by the second capacitor unit C2. A width of the first internal electrodes 121 included in the first capacitor unit C1 can be the same as a width W1 of the lead out portions R1 and R2, but the width W1 of the lead out portions R1 and R2 may be less than a width of the first internal electrodes 121.

As illustrated in FIG. 4, the first internal electrode 123 included in the second capacitor unit C2 may be connected to the first external electrodes 142 through the lead out portion R5 exposed to at least one of the first surface S1 and the second surface S2. The first internal electrode may have a form in which the lead out portion R5 is only led out to the second surface S2. The second internal electrodes 124 included in the second capacitor unit C2 may be connected to the second external electrodes 151 and 152 through the lead out portion R6 exposed to at least one of the third surface S3 and the fourth surface S4. The second internal electrodes may have a form in which the lead out portion R6 is only formed in the fourth surface S4.

The lead out portion R5 of the first internal electrodes 123 in the second capacitor unit C2 may be disposed in a position to one side of a center line CL of the first internal electrodes 123 in one direction (based on FIG. 4). The lead out portion R6 of the second internal electrodes 124 in the second capacitor unit C2 may be disposed in a position to one side of the center line CL of the second internal electrodes 124, and may be disposed in a position to a side of the center line CL of the first internal electrodes 123 in a direction away from the lead out portion R5. With a structure as described above, the lead out portions R5 and R6 are spaced apart from each other to relatively increase ESL of the second capacitor unit C2. Thus, the second capacitor unit C2 may allow resonance frequencies on a low frequency side to be generated.

As illustrated in FIGS. 3 and 4, a width W2 of the lead out portions R3 and R4 of the second internal electrodes 122 in the first capacitor unit C1 can be greater than a width W4 of the lead out portion R6 of the second internal electrodes 124 in the second capacitor unit C2. With a structure as described above, ESL of the second capacitor unit C2 is increased to promote generation of resonance frequencies on a low-frequency side.

In the capacitor component 100 having a structure as described above, the first capacitor unit C1 is provided as a through-type capacitor having low ESL to generate resonance frequencies in a high-frequency side, and the second capacitor unit C2 has high ESL to generate resonance frequencies on a low-frequency side. The second capacitor unit C2 is disposed on the first capacitor unit C1. In this case, the first capacitor unit C1 may be disposed to be closer to a mounting substrate as compared to the second capacitor unit C2 to more effectively exhibit lower ESL characteristics.

Figure 5:
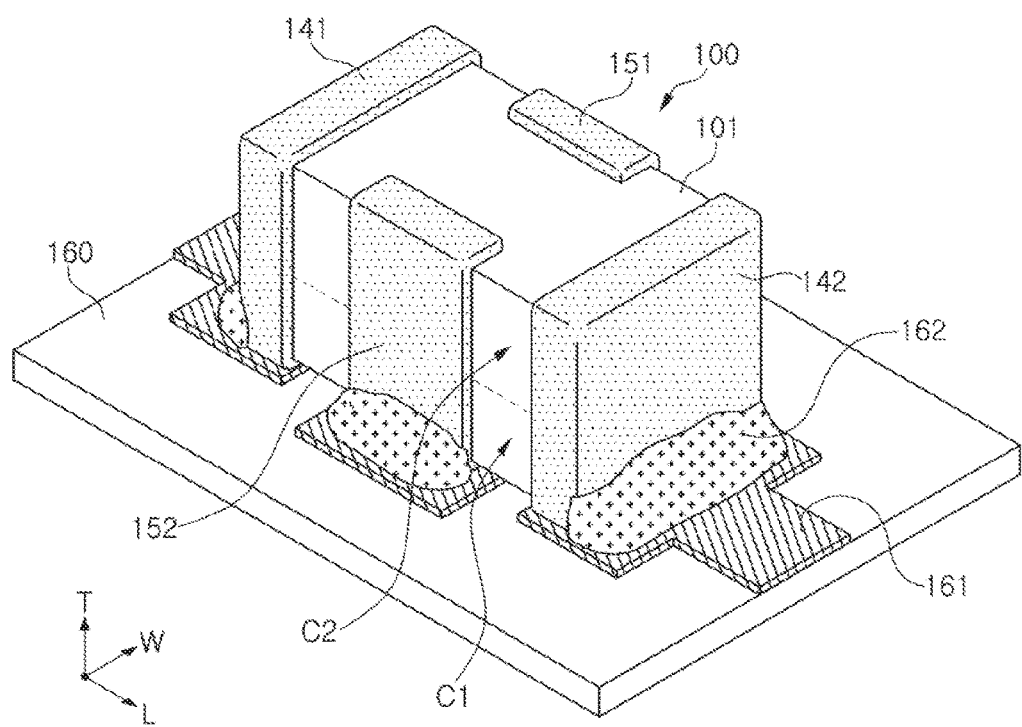
FIG. 5 illustrates a form in which a capacitor component according to an exemplary embodiment is mounted on a substrate.

The capacitor component 100 may be mounted as illustrated in FIG. 5, to obtain a capacitor mounting structure. In the capacitor component 100, the first capacitor unit C1 opposes the mounting substrate 160, and the mounting substrate 160 may include three circuit patterns 161 connected to the first external electrodes 141 and 142 as well as second external electrodes 151 and 152 of the capacitor component 100. A solder 162 may be provided to stably mount the capacitor component 100. The capacitor component 100 may be disposed in a horizontal mounting method, that is, with the first internal electrodes 121 and 122 as well as second internal electrodes 123 and 124 parallel to a mounting surface. In a manner similar to the capacitor mounting structure in FIG. 5, the first capacitor unit C1 with low ESL can be disposed to be closer to the mounting substrate 160 as compared to the second capacitor unit C2 to further improve characteristics in a high frequency band of the capacitor component 100. To mark a mounting direction of the capacitor component 100, a marking unit M may be formed in the body 101 in an exemplary embodiment in FIG. 7 to be described later.

Figure 6:
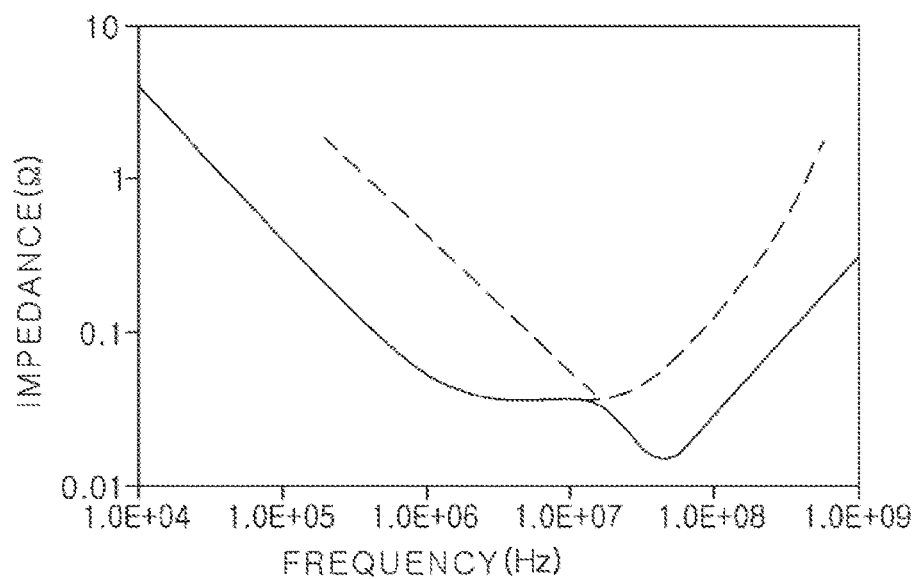
FIG. 6 is a graph illustrating impedance characteristics of a capacitor component obtained according to an exemplary embodiment.

FIG. 6 is a graph illustrating impedance characteristics of a capacitor component obtained according to an exemplary embodiment. As seen in an impedance characteristics graph in FIG. 6, for the capacitor component 100 according to an exemplary embodiment, two types of capacitors (a first capacitor unit and a second capacitor unit) with different resonance frequencies are included within a single component to maintain impedance at a low level in a wide frequency band. Thus, the capacitor component 100 described above can be used to reduce the number of decoupling capacitors used in a power supply device, a high-speed MPU or the like, and to effectively reduce mounting costs or space of a decoupling capacitor.

Figure 7:
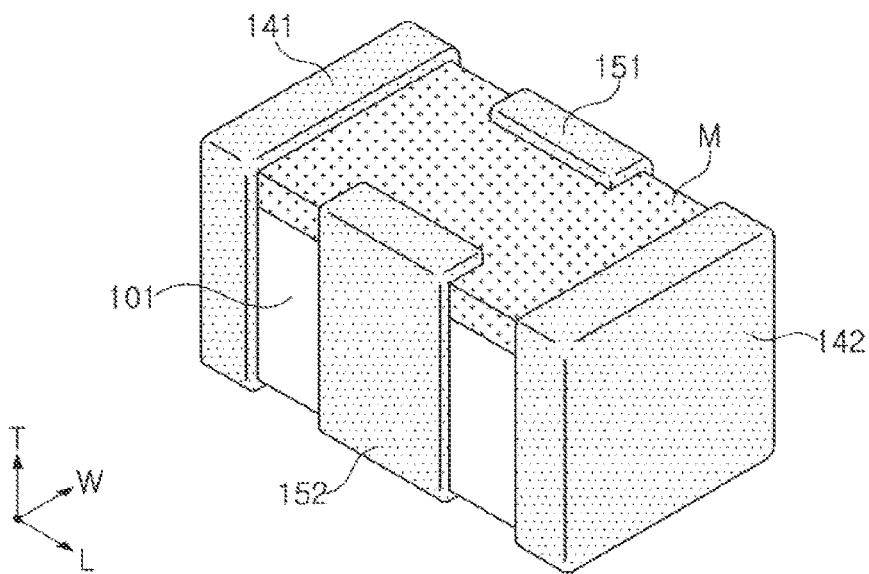
FIG. 7 is a perspective view schematically illustrating a capacitor component of a modified example.
Figure 8:
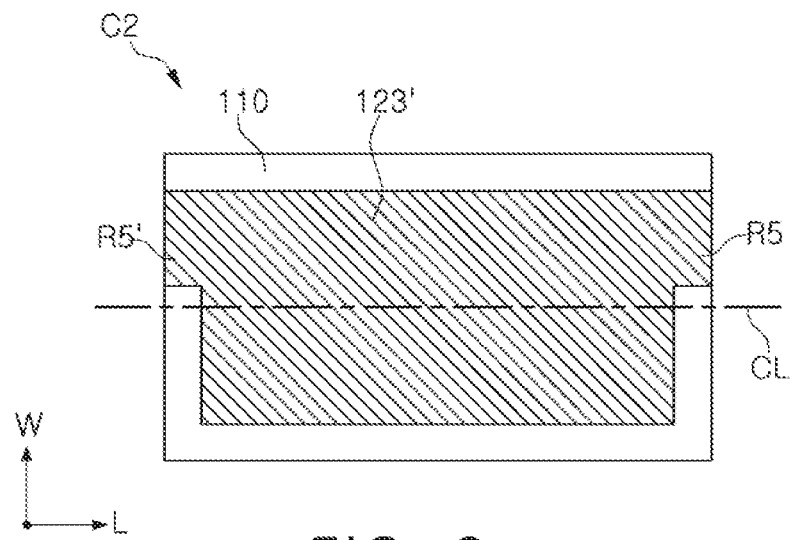
FIG. 8 is a plan view schematically illustrating a form of a first internal electrode included in a second capacitor unit in a capacitor component according to a modified example.
Figure 9:
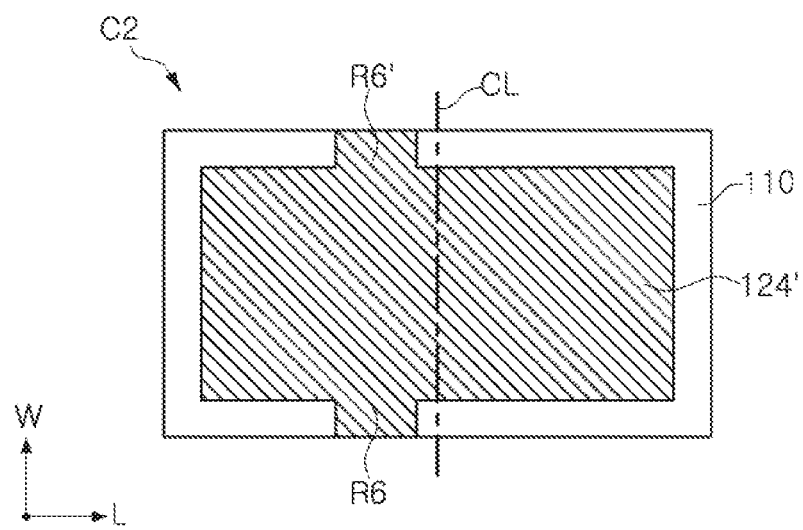
FIG. 9 is a plan view schematically illustrating a form of a second internal electrode included in a second capacitor unit in a capacitor component according to a modified example.

With reference to FIGS. 7 to 9, a modified exemplary embodiment is described. In the modified example of FIG. 7, a marking unit M for indicating a mounting direction of a capacitor component may be formed. A mounting direction may be easily recognized by the marking unit M, and the first capacitor unit C1 may be disposed to be close to a mounting substrate with reference to the mounting direction. The marking unit M described above may be formed of ceramic, a different material from that of a different region of the body 101.

FIGS. 8 and 9 are plan views schematically illustrating a form of a first internal electrode and a second internal electrode included in a second capacitor unit in a capacitor component according to a modified example. As illustrated in the form illustrated in FIGS. 8 and 9, the number of lead out portions included in the first internal electrodes 123' and the second internal electrodes 124' of the second capacitor unit C2 may be different from an exemplary embodiment as described previously. The first internal electrodes 123' in the second capacitor unit C2 include lead out portions R5' and R5 respectively exposed to the first surface S1 and the second surface S2 to respectively be connected to the first external electrodes 141 and 142. The second internal electrodes 124' in the second capacitor unit C2 include lead out portions R6' and R6 respectively exposed to a third surface S3 and a fourth surface S4 to respectively be connected to the second external electrodes 151 and 152. In a modified example, the number of lead out portions of the first internal electrodes 123' and the second internal electrodes 124' in the second capacitor unit C2 may be increased to reduce overall equivalent series resistance ESR of a capacitor component.

As set forth above, according to an exemplary embodiment, an impedance reduced capacitor component for effectively removing noise from a wide frequency band may be obtained.

While exemplary embodiments have been shown and described above, it will be apparent to those skilled in the art that modifications and variations could be made without departing from the scope of the present invention as defined by the appended claims.

What is claimed is:

1. A capacitor component comprising:
a body including a plurality of dielectric layers, a plurality of first internal electrodes, and a plurality of second internal electrodes, with the first and second internal electrodes alternately stacked with dielectric layers interposed therebetween;
two first external electrodes, one first external electrode on a first surface of the body and another first external electrode on a second surface on an opposing side of the body, each of the first external electrodes connected to one or more of the plurality of first internal electrodes;
and two second external electrodes, one second external electrode on a third surface of the body and another second external electrode on a fourth surface on an opposing side of the body, each of the second external electrodes connected to one or more of the plurality of second internal electrodes,
wherein the capacitor component is divided into a plurality of capacitor units, each of the plurality of capacitor units including a portion of the plurality of first internal electrodes and a portion of the plurality of second internal electrodes, the plurality of capacitor units including at least a first capacitor unit and a second capacitor unit,
the first capacitor unit is a through-type capacitor in which one or more of the plurality of first internal electrodes included therein is connected to the first external electrode by lead out portions respectively exposed to the first surface and the second surface,
a lead out portion, having a widthwise direction and a first edge directed away from the widthwise direction, exposed to the second surface of the body of one or more of the plurality of first internal electrodes included in the first capacitor unit has a width greater than a width of a lead out portion, having a widthwise direction and a second edge directed away from the widthwise direction and overlapping the first edge, exposed to the second surface of the body of one or more of the plurality of first internal electrodes included in the second capacitor unit,
wherein one or more of the plurality of second internal electrodes included in the first capacitor unit is connected to the second external electrode through lead out portions respectively exposed to the third surface and the fourth surface,
wherein one or more of the plurality of second internal electrodes included in the second capacitor unit is connected to the second external electrode through one or more lead out portions exposed to at least one of the third surface and the fourth surface,
wherein the lead out portion exposed to the fourth surface of the body of one or more of the plurality of second internal electrodes included in the first capacitor unit has a width greater than that of the lead out portion exposed to the fourth surface of the body of one or more of the plurality of second internal electrodes included in the second capacitor unit,
wherein the body includes a marking unit indicating a mounting direction of the capacitor component,
and wherein the marking unit is formed of a ceramic and a different material from that of a different region of the body.

2. The capacitor component of claim 1, wherein at least a portion of the plurality of capacitor units generates different resonance frequencies from those of a remaining portion thereof.

3. The capacitor component of claim 1, wherein one or more of the plurality of first internal electrodes included in the second capacitor unit is connected to the first external electrode by the lead out portion.

4. The capacitor component of claim 1, wherein the lead out portion of one or more of the plurality of first internal electrodes included in the second capacitor unit is disposed in a position to one side of a center line of the first internal electrode.

5. The capacitor component of claim 4, wherein a lead out portion of one or more of the plurality of second internal electrodes included in the second capacitor unit is disposed in a position to one side of a center line of the second internal electrode.

6. The capacitor component of claim 5, wherein the lead out portion of one or more of the plurality of second internal electrodes included in the second capacitor unit is disposed in a position to one side of a center line of the second internal electrode in a direction away from the lead out portion of one or more of the plurality of first internal electrodes included in the second capacitor unit.

7. The capacitor component of claim 1, wherein the second capacitor unit is disposed on the first capacitor unit.

8. A mounting structure of a capacitor component comprising:
   a capacitor component including:
   a body including a plurality of dielectric layers, a plurality of first internal electrodes, and a plurality of second internal electrodes, with the first and second internal electrodes alternately stacked with dielectric layers interposed therebetween;
   two first external electrodes, one first external electrode on a first surface of the body and another first external electrode on a second surface on the opposing side of the body, each of the first external electrodes connected to one or more of the plurality of first internal electrodes,
   and two second external electrodes, one second external electrode on a third surface of the body and another second external electrode on a fourth surface on an opposing side of the body, each of the second external electrodes connected to one or more of the plurality of second internal electrodes,
   wherein the capacitor component is divided into a plurality of capacitor units, each of the plurality of capacitor units including a portion of the plurality of first internal electrodes and a portion of the plurality of second internal electrodes; the plurality of capacitor units including at least a first capacitor unit and a second capacitor unit,
   the first capacitor unit is a through-type capacitor in which one or more of the first internal electrodes included therein is connected to the first external electrode by lead out portions respectively exposed to the first surface and the second surface,
   a lead out portion, having a widthwise direction and a first edge directed away from a widthwise direction, exposed to the second surface of the body of one or more of the plurality of first internal electrodes included in the first capacitor unit has a width greater than a width of a lead out portion, having a widthwise direction and a second edge directed away from a widthwise direction and overlapping the first edge, exposed to the second surface of the body of one or more of the plurality of first internal electrodes included in the second capacitor unit;
   and a mounting substrate on which the capacitor component is disposed,
   wherein one or more of the plurality of second internal electrodes included in the first capacitor unit is connected to the second external electrode through lead out portions respectively exposed to the third surface and the fourth surface,
   wherein one or more of the plurality of second internal electrodes included in the second capacitor unit is connected to the second external electrode through one or more lead out portions exposed to at least one of the third surface and the fourth surface,
   wherein the lead out portion exposed to the fourth surface of the body of one or more of the plurality of second internal electrodes included in the first capacitor unit has a width greater than that of the lead out portion exposed to the fourth surface of the body of one or more of the plurality of second internal electrodes included in the second capacitor unit,
   wherein the body includes a marking unit indicating a mounting direction of the capacitor component,
   and wherein the marking unit is formed of a ceramic and a different material from that of a different region of the body.

9. The mounting structure of a capacitor component of claim 8, wherein the first capacitor unit of the capacitor component opposes the mounting substrate.

10. The mounting structure of a capacitor component of claim 8, wherein the mounting substrate includes three circuit patterns connected to the first external electrode and the second external electrode.

* * * * *